United States Patent
Wang et al.

(10) Patent No.: US 9,893,458 B2
(45) Date of Patent: Feb. 13, 2018

(54) DUST-PROOF COVER AND ELECTRICAL CONNECTOR ASSEMBLY USING THE SAME

(71) Applicant: FOXCONN INTERCONNECT TECHNOLOGY LIMITED, Grand Cayman (KY)

(72) Inventors: Quan Wang, Shenzhen (CN); Fu-Jin Peng, Shenzhen (CN); Shan-Jun Chen, Shenzhen (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/358,084

(22) Filed: Nov. 21, 2016

(65) Prior Publication Data
US 2017/0149168 A1    May 25, 2017

(30) Foreign Application Priority Data
Nov. 21, 2015  (CN) .................... 2015 2 0929840 U

(51) Int. Cl.
*H01R 13/447*  (2006.01)
*H01R 13/52*  (2006.01)
*H01R 12/70*  (2011.01)

(52) U.S. Cl.
CPC ..... *H01R 13/5213* (2013.01); *H01R 12/7076* (2013.01)

(58) Field of Classification Search
CPC ............. H01R 13/447; H01R 13/5213; H01R 43/205; H05K 13/0408

USPC .................... 439/135, 940, 331, 41
See application file for complete search history.

(56) References Cited

U.S. PATENT DOCUMENTS

| | | | | |
|---|---|---|---|---|
| 7,090,517 | B2* | 8/2006 | Ma .................. | H05K 7/1061 439/135 |
| 7,530,822 | B2* | 5/2009 | Liao ................ | H01R 43/205 439/135 |
| 7,575,449 | B1* | 8/2009 | Cai .................. | H05K 7/1053 439/135 |
| 7,866,985 | B2* | 1/2011 | Hsu ................. | H05K 7/1061 439/135 |

(Continued)

FOREIGN PATENT DOCUMENTS

CN        2520026 Y        11/2002

*Primary Examiner* — Gary Paumen
(74) *Attorney, Agent, or Firm* — Wei Te Chung; Ming Chieh Chang

(57) ABSTRACT

An electrical connector assembly is used for connecting to a chip module. The electrical connector assembly includes an electrical connector and a dust-proof cover. The electrical connector includes an insulative housing, a plurality of terminals and a shell covering the insulative housing. The insulative housing includes a second cavity for receiving the chip module. The shell defines an opening corresponding to the second cavity. The dust-proof cover includes a dust-proof portion covering the opening and a pair of inclined pushing portions protruding from the dust-proof portion to the second cavity. The dust-proof cover has a plurality of supporting portions for supporting the dust-proof portion. The supporting portions separate from the shell when the inclined pushing portion is pushed by the chip module, and the dust-proof cover separates from the electrical connector.

20 Claims, 6 Drawing Sheets

(56) References Cited

U.S. PATENT DOCUMENTS

| | | | |
|---|---|---|---|
| 8,137,121 B2 * | 3/2012 | Dai ..................... | H05K 7/1053 439/135 |
| 8,747,120 B2 * | 6/2014 | Terhune, IV ........ | H05K 7/1053 439/41 |
| 2014/0057470 A1 | 2/2014 | Hai | |

\* cited by examiner

DUST-PROOF COVER AND ELECTRICAL CONNECTOR ASSEMBLY USING THE SAME

1. FIELD OF THE INVENTION

The present invention relates to an electrical connector assembly with a dust-proof cover thereon.

2. DESCRIPTION OF THE PRIOR ART

In the traditional technology, an electrical connector assembly includes an insulative housing, a plurality of terminals received in the insulative housing and a dust-proof cover disposed above the insulative housing. The dust-proof cover is shaped as a plate, e.g. U.S. Pat. No. 7,090,517. When the dust-proof cover is mounted to the insulative housing, the dust-proof cover can not be locked to the insulative housing steadily. The dust-proof cover can not align with the insulative housing accurately, so the terminals of the insulative housing will be damaged.

SUMMARY OF THE INVENTION

Accordingly, an object of the present invention is to provide an electrical connector assembly used for connecting to or loading a chip module. The electrical connector assembly includes an electrical connector and a dust-proof cover. The electrical connector includes an insulative housing, a plurality of terminals and a shell covering the insulative housing. The insulative housing includes a second cavity for receiving the chip module. The shell defines an opening corresponding to the second cavity. The dust-proof cover originally attached to the shell, includes a dust-proof portion covering the opening and a pair of inclined pushing portions protruding from the dust-proof portion to the second cavity. The dust-proof cover has a plurality of supporting portions for supporting the dust-proof portion. During downwardly moving the shell toward the housing, the dust-proof cover is forcibly separated from the shell when the inclined pushing portion contacts and is successively upwardly pushed by the chip module.

DESCRIPTION OF PREFERRED EMBODIMENT

Figure 1:
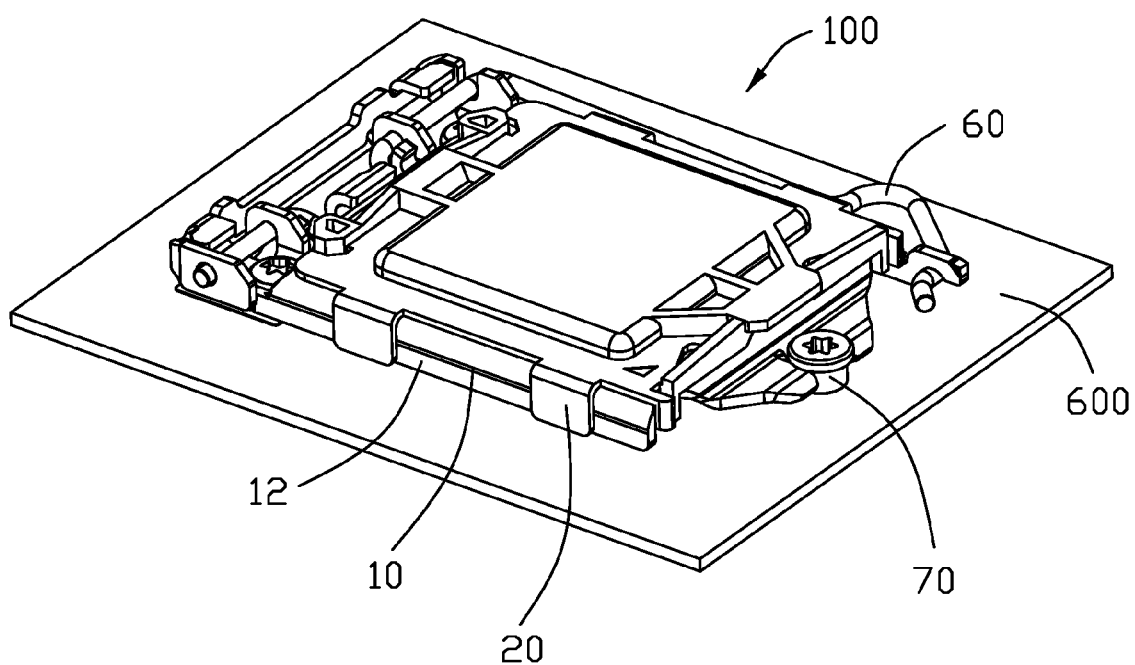
FIG. 1 is a perspective view of an electrical connector assembly in accordance with the present invention.

Reference will now be made to the drawings to describe the present invention in detail.

Referring to FIGS. 1-5(B), an electrical connector assembly 100 used for connecting to a chip module 500 includes an electrical connector 10 mounted upon a printed circuit board 600 and a dust-proof cover 20 locked to the electrical connector 10. The dust-proof cover 20 can prevent dust from going into the electrical connector 10.

Figure 2:
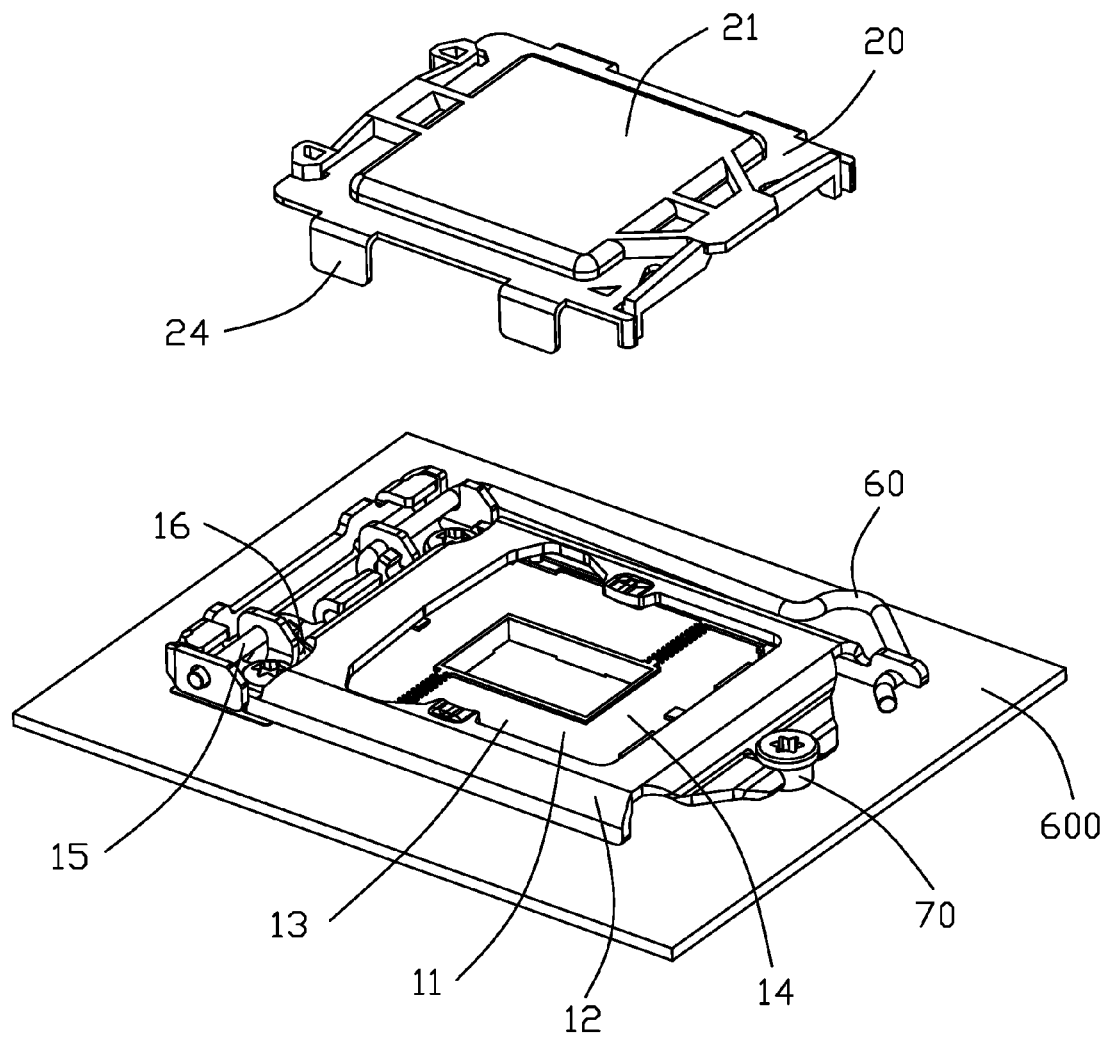
FIG. 2 is an exploded perspective view of the electrical connector assembly shown in FIG. 1.

Referring to FIG. 2, the electrical connector 10 includes an insulative housing 11, a plurality of terminals (not labeled) received in the insulative housing 11 and a metallic shell or loading plate 12 covering the insulative housing 11. The insulative housing 11 includes a second cavity 13 for receiving the chip module 500. The shell 12 includes an opening 14 corresponding to the second cavity 13. The dust-proof cover 20 is disposed above the shell 12, so the dust-proof cover 20 prevent dust from going into the electrical connector 10 through the opening 14 of the shell 12. The electrical connector 10 includes a connecting member 15 disposed at one side of the insulative housing 11. The shell 12 pivotally connects to the connecting member 15 and rotatably covers the insulative housing 11, and the lever 60, which is linked with the shell 12 in a pivotal manner, is rotated to urge the shell 12 forwardly to be downwardly engaged with the locking head 70.

Figure 3:
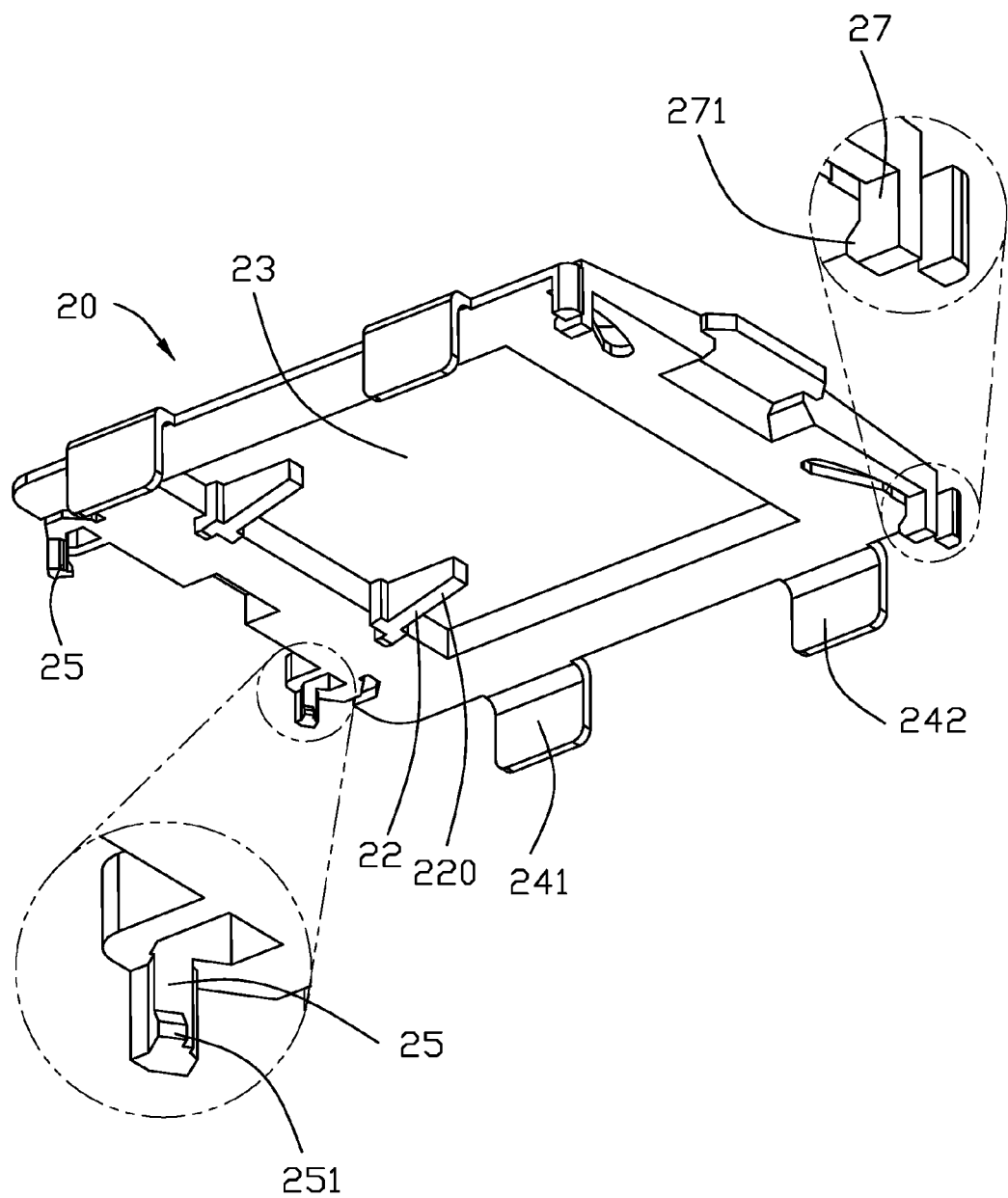
FIG. 3 is a perspective view of the dust-proof cover shown in FIG. 2.
Figure 4:
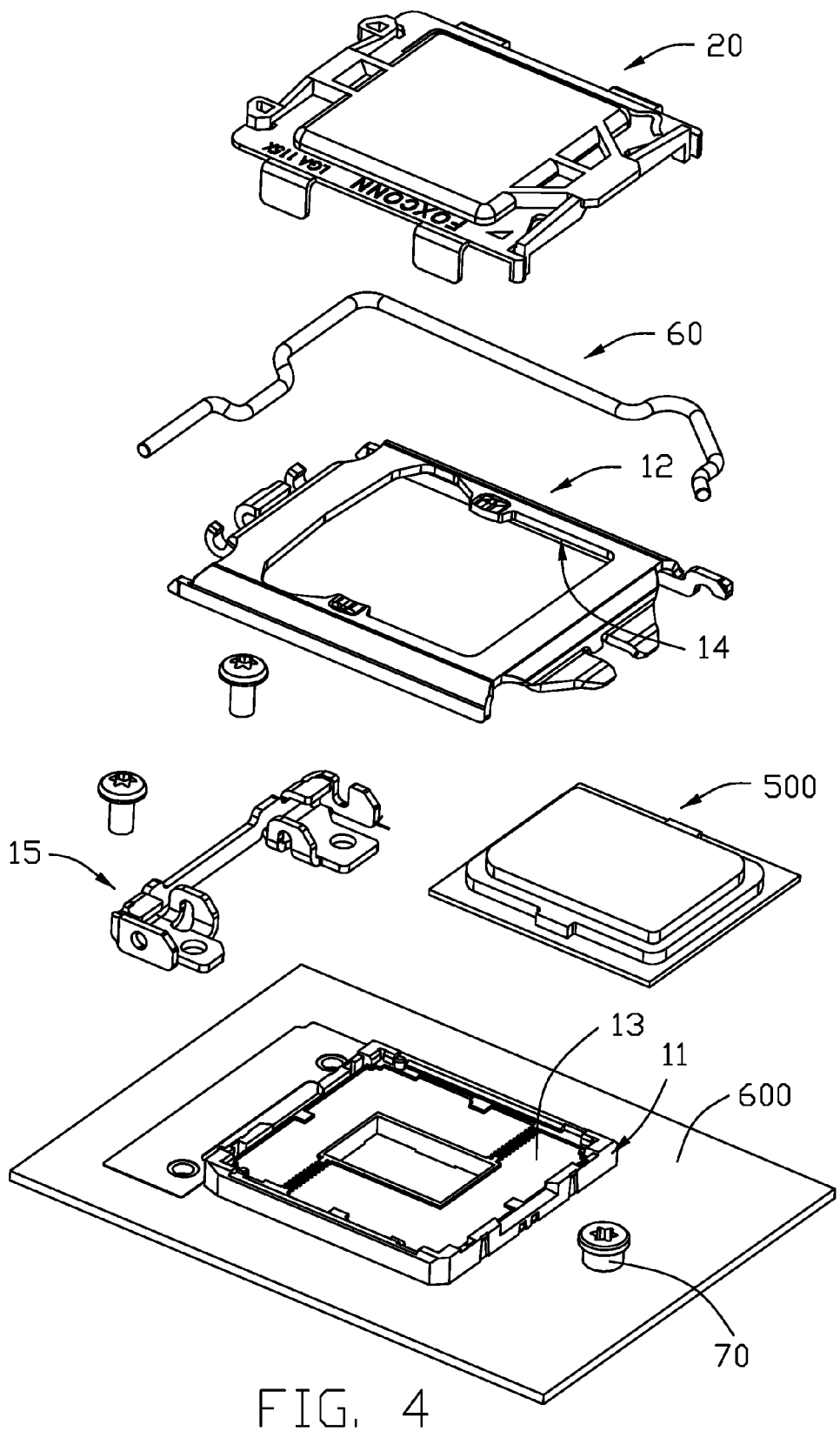
FIG. 4 is an exploded perspective view of the electrical connector assembly of FIG. 1.
Figure 5A:
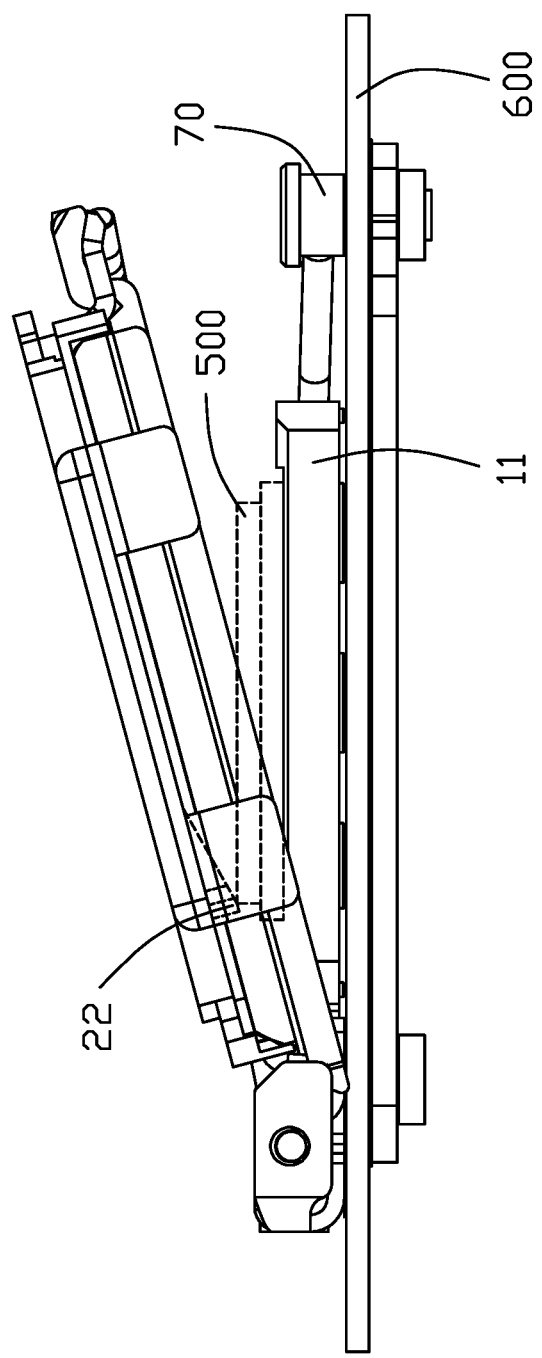
FIG. 5(A) is a side view to show the dust-proof cover associated with the shell approaching the chip module with the inclined pushing portion confronting the chip module.
Figure 5B:
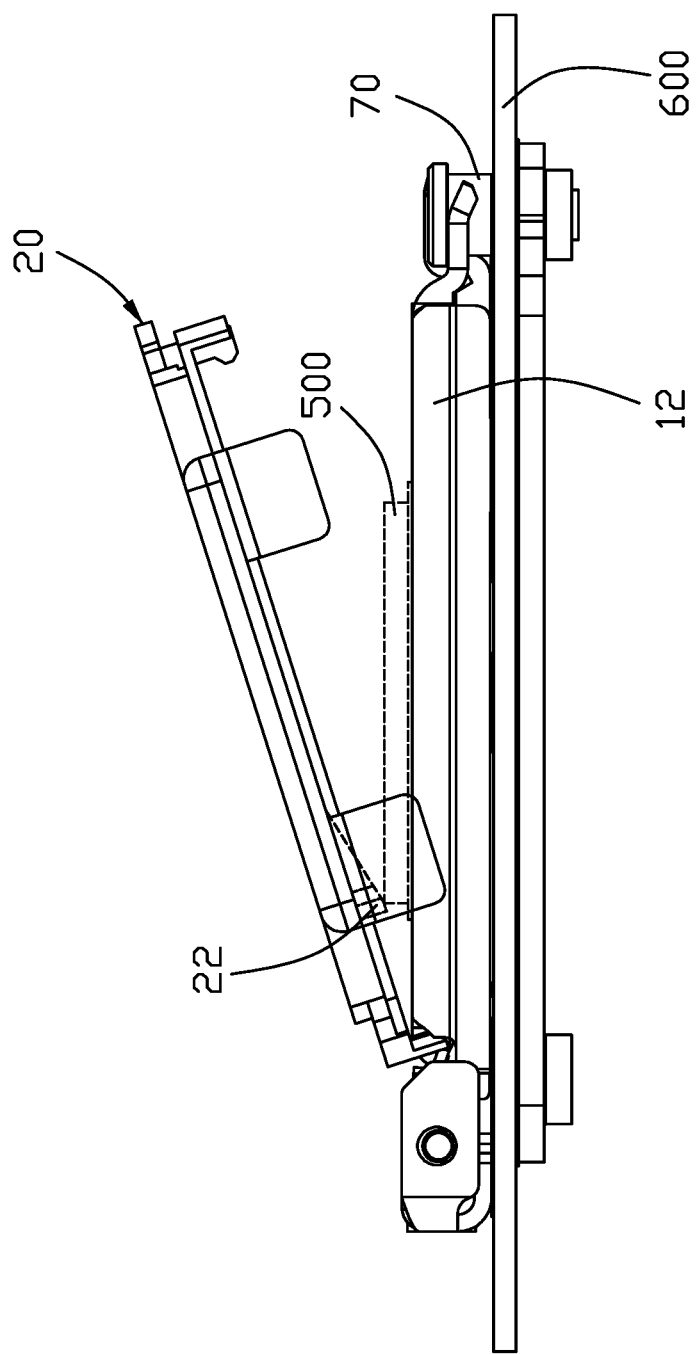
FIG. 5(B) is a side view to show the dust-proof cover is separated from the shell while the shell is fastened to the locking head on the printed circuit board.

Referring to FIG. 3, the dust-proof cover 20 includes a dust-proof portion 21 covering the opening 14 and a pair of inclined pushing portions 22 protruding from the dust-proof portion 21 to the second cavity 13. The inclined pushing portion 22 includes an inclined pushing face 220. The dust-proof portion 21 defines a first cavity 23 facing to the opening 14 of the shell 12. The inclined pushing portions 22 are disposed in the first cavity 23. The dust-proof cover 20 has a pair of positioning arms or rigid latches 25 at one side thereof. The shell 12 defines a pair of positioning slots 16 corresponding to the positioning arms 25 respectively. The dust-proof cover 20 is positioned in a preset position of the shell 12 when the positioning arms 25 are fixed in the positioning slots 16 respectively. The inclined pushing portions 22 are disposed closed to the positioning arms 25. The dust-proof cover 20 also includes a plurality of supporting portions 24 at two opposite sides thereof. The supporting portions 24 are disposed at two lateral sides of the shell 12 respectively. The supporting portions 24 and the inclined pushing portions 22 extend in a same direction. The supporting portions 24 include a first supporting portion 241 and a second supporting portion 242 disposed at one side of the dust-proof portion 21. In other embodiments, the supporting portions 24 can also be disposed in the inner side of the opening 14.

The dust-proof cover 20 is disposed above the shell 12. Before the chip module 500 is put into the electrical connector assembly 100, the dust-proof cover 20 covers the insulative housing 11 with the shell 12, and the supporting portions 24 can support the dust-proof portion 21. The supporting portions prevent the inclined pushing portions 22 from damaging the terminals of the insulative housing 11. When the chip module 500 is put into the second cavity 13 of the electrical connector 10, the dust-proof cover 20 rotatably covers the insulative housing 11 with the shell 12, and the inclined pushing portions 22 are pushed by the chip module 500, and the supporting portions 24 separate from the shell 12, and the dust-proof cover 20 separates from the electrical connector 10. It is easy to install and remove the dust-proof cover 20.

Notably, the dust-proof cover 20 has a pair of relatively resilient latches 27 at the front end region each with a corresponding latching hook 271, and a pair of relatively rigid latches 25 at the rear end region each with the corresponding latching hook 251. When the cover 20 is mounted upon the shell 12, both the latches 27 and latches 25 are engaged with the corresponding portions of the shell 12.

When the shell 12 with the associated dust-proof cover 20 is downwardly rotated toward the housing 11, initially the inclined pushing portion 22 of the dust-proof cover 20 is upwardly urged by the chip module 500 and successively the latches 27 will be disengaged from the shell 12 to have the cover 20 removed from the shell 12 in a rotational manner about the inclined pushing portion 22. The removal is deemed essentially automatic during fastening the shell 12 in position by engagement between the shell 12 and the locking head 70 via rotation of the lever 60. The supporting portions 24 may assure the smooth removal of the cover 20 from the shell 12 compared with no provision of those supporting portions.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A dust-proof cover used for an electrical connector comprising:
    a dust-proof portion extending horizontally;
    at least one inclined pushing portions disposed at one side of the dust-proof portion, the inclined pushing portion having an inclined pushing face obliquely with respect to the dust-proof portion; and
    a plurality of supporting portions for supporting the dust-proof portion, wherein the inclined pushing portion is configured to be upwardly pushed by a chip module received within the electrical connector to have the dust-proof cover removed from the electrical connector; wherein
    said supporting portions are located at two opposing lateral sides of the dust-proof cover in a transverse direction and configured to transversely abut against the electrical connector and sandwich the electrical connector therebetween to guide removal of the dust-proof cover from the electrical connector.

2. The dust-proof cover as claimed in claim 1, wherein the dust-proof cover defines a first cavity disposed at one side of the inclined pushing portion, the inclined pushing portion is disposed in the first cavity.

3. The dust-proof cover as claimed in claim 1, wherein the supporting portions are disposed at two opposite sides of the dust-proof portion, the supporting portions and the inclined pushing portions extend in a same direction.

4. The dust-proof cover as claimed in claim 1, further including a pair of relatively resilient latches at a font end region and a pair of relatively rigid latches at a rear end region, wherein said inclined pushing portion is located closer to the relatively rigid latches than to the relatively resilient latches.

5. An electrical connector assembly used for connecting to a chip module, the electrical connector assembly comprising:
    an electrical connector having an insulative housing, a plurality of terminals received in the insulative housing and a metallic shell covering the insulative housing, the insulative housing having a cavity for receiving the chip module, the shell defining an opening corresponding to the cavity;
    a dust-proof cover attached to the shell and having a dust-proof portion covering the opening, at least one pushing portion protruding downwardly from the dust-proof portion toward the second cavity; wherein
    the dust-proof cover has a plurality of supporting portions for supporting the dust-proof portion; wherein
    when the dust-proof cover is associatively attached upon the shell to commonly approach the housing, the pushing portion is upwardly pushed by said chip module received within the housing of electrical connector so as to have the dust-proof cover separated from the shell; wherein
    said supporting portions are located on two opposing lateral sides of the dust-proof cover in a transverse direction and transversely abut against the shell of the electrical connector and sandwich the shell therebetween to guide removal of the dust-proof cover from the shell of the electrical connector.

6. The electrical connector assembly as claimed in claim 5, wherein said pushing portion is located closer to a rear end region of the dust-proof cover than to a front end region of the dust-proof cover.

7. The electrical connector assembly as claimed in claim 6, wherein the dust-proof cover includes a pair of relatively resilient latches at the front end region and a pair of relatively rigid latches at the rear end region.

8. The electrical connector assembly as claimed in claim 5, wherein the dust-proof cover defines another cavity corresponding to the opening, the pushing portions are disposed in said another cavity.

9. The electrical connector assembly as claimed in claim 5, wherein the supporting portions are disposed at two opposite sides of the dust-proof portion, the supporting portions and the pushing portion extend in a same direction.

10. The electrical connector assembly as claimed in claim 5, wherein the supporting portions are disposed at two lateral sides of the shell.

11. The electrical connector assembly as claimed in claim 5, wherein the electrical connector comprises a connecting member located one side of the insulative housing, and the shell is pivotally connected to the connecting member and rotatably covers the insulative housing.

12. The electrical connector assembly as claimed in claim 11, wherein said shell is pivotally connected to a lever, and said lever is pivotally connected to the connecting member.

13. The electrical connector assembly as claimed in claim 5, wherein said pushing portion forms an inclined pushing face extending along an oblique direction angled with a front-to-back direction.

14. The electrical connector assembly as claimed in claim 5, wherein said shell is pivotally mounted to a lever, and the lever is pivotally mounted to the connecting member.

15. An electrical connector assembly comprising:
    an insulative housing defining an upward receiving cavity adapted to receive a chip module therein;
    a metallic shell pivotally connected around a rear end of the housing and defining an opening aligned with the receiving cavity in a vertical direction when the shell covers said housing so as to allow said chip module to upwardly extend without interference; and
    a dust-proof cover attached upon the shell and including, in a front-to-back direction perpendicular to said vertical direction, a pair of front latches around a front end region and a pair of rear latches around a rear end region to respectively engage with the shell, wherein
    said dust-proof cover further includes at least a pushing portion extending downwardly toward the receiving cavity, and a plurality of supporting portions commonly sandwiching the shell therebetween in a transverse direction perpendicular to both said vertical direction and said front-to-back direction so as to assure stable removal of the dust-proof cover from the shell via confrontation between the pushing portion and the chip module.

16. The electrical connector assembly as claimed in claim 15, wherein the pushing portion is located around the rear end region.

17. The electrical connector assembly as claimed in claim 16, wherein said dust-proof cover is pivotally removed from the shell in a rotatable manner about said pushing portion.

18. The electrical connector assembly as claimed in claim 17, wherein the latches around the front end region are more resilient than the latches around the rear end region.

19. The electrical connector assembly as claimed in claim 15, wherein said pushing portion forms an inclined face extending along an oblique direction angled with the front-to-back direction.

20. The electrical connector assembly as claimed in claim 15, wherein said shell is indirectly attached to a connecting member via a lever which actuates the shell to be locked with a locking head around a front end of the housing, and said connecting member is located around the rear end of the housing.

* * * * *